United States Patent [19]

Satoh

[11] Patent Number: 5,014,110
[45] Date of Patent: May 7, 1991

[54] WIRING STRUCTURES FOR SEMICONDUCTOR MEMORY DEVICE

[75] Inventor: Shinichi Satoh, Hyogo, Japan

[73] Assignee: Mitsubishi Denki Kabushiki Kaisha, Tokyo, Japan

[21] Appl. No.: 337,723

[22] Filed: Apr. 12, 1989

[30] Foreign Application Priority Data

Jun. 3, 1988 [JP] Japan ............................ 63-138003
Aug. 9, 1988 [JP] Japan ............................ 63-199139

[51] Int. Cl.$^5$ ............................................ H01L 23/48
[52] U.S. Cl. .................................. 357/68; 357/23.6; 357/40; 357/45; 357/71
[58] Field of Search ............... 357/68, 71, 71 S, 71 P, 357/23.6, 40, 45

[56] References Cited

U.S. PATENT DOCUMENTS

| 3,942,164 | 3/1976 | Dunn . | |
|---|---|---|---|
| 4,484,212 | 11/1984 | Komatsu et al. | 357/68 |
| 4,688,070 | 8/1987 | Shiotari et al. | 357/68 |
| 4,716,452 | 12/1987 | Kondoh et al. | 357/68 |
| 4,746,965 | 5/1988 | Nishi | 357/68 |

FOREIGN PATENT DOCUMENTS

| 0167281 | 8/1986 | European Pat. Off. . | |
|---|---|---|---|
| 57-84149 | 5/1982 | Japan | 357/40 |
| 60-180159 | 9/1985 | Japan | 357/68 |
| 62-51096 | 3/1987 | Japan | 357/68 |
| 63-183691 | 7/1988 | Japan | 357/23.6 |

OTHER PUBLICATIONS

IEEE Journal of Solid-State Circuit, vol. SC-22, No. 5, Oct. '87, "A 65-ns 4-Mbit CMOS DRAM with a Twisted Driveline Sense Amplifier", by Kimura et al.
Patrick W. Bosshart et al., "A 553K-Transistor LISP Processor Chip", 1987 IEEE International Solid State Circuits Conference, Feb. 26, 1987., pp. 202-203.
"Double-Traversing Pseudo-Bitline Design for Cross-Point Memory Cells", *IBM Technical Disclosure Bulletin*, vol. 30, No. 11, Apr. 1988, pp. 246-248.

*Primary Examiner*—Rolf Hille
*Assistant Examiner*—Steven Loke
*Attorney, Agent, or Firm*—Lowe, Price, Leblanc, Becker & Shur

[57] ABSTRACT

A semiconductor memory comprises a semiconductor substrate (1), word lines (200) and bit lines (3a, 3b), memory cells and sense amplifier (SA). The semiconductor substrate (1) has a major surface. The word lines (200) and bit lines (3a, 3b) intersect each other on the major surface of the substrate (1). The bit lines (3a, 3b) are arranged in the form of parallel bit line pairs. The memory cells are arranged at intersections of the word lines (200) and the bit lines (3a, 3b). The sense amplifier (SA) senses voltage differentials of the bit line pairs. Corresponding sections of the bit lines (3a, 3b) of the bit line pair are interchanged laterally on the substrate (1) along the length of the bit line pair. Corresponding sections of the bit lines (3a, 3b) of each bit line pair have the same number of joining portions (10) respectively. It is possible to provide a semiconductor memory device having a wiring structure capable of minimizing an influence due to the noise from the adjacent wiring line.

19 Claims, 11 Drawing Sheets

WIRING STRUCTURES FOR SEMICONDUCTOR MEMORY DEVICE

BACKGROUND OF THE INVENTION

1. Field of the Invention

The present invention relates generally to wiring structures for semiconductor memory devices and manufacturing method therefor and, more particularly, to "twisted wiring pair" for the signal line for semiconductor memory devices and manufacturing method therefor. The invention has particular utility in the field of folded bit line type of dynamic random access memory (DRAM).

2. Description of Background Art

Since the most preferable effect can be obtained when the present invention is applied to a dynamic random access memory, a description is made of the dynamic random access type in the following.

A dynamic random access memory has been already well known. FIG. 1 is a block diagram showing one of examples of the whole structure of such a conventional dynamic random access memory (which is hereinafter referred to as a DRAM).

Referring to FIG. 1, the DRAM comprises a memory cell array 41 comprising a plurality of memory cells serving as a memory portion, a row decoder 42 connected to an address buffer selecting its address, a column decoder 43 and an input/output interface portion comprising a sense amplifier connected to an input/output circuit. Each of the plurality of memory cells serving as the memory portion is connected to an intersection point between one of word lines connected to the row decoder 42 and one of bit lines arranged to the column decoder 43, which are constituted in a matrix fashion, to constitute the memory cell array 41. When a row address signal and a column address signal externally applied are received, the row decoder 42 and the column decoder 43 select a memory cell which is located at the intersection point between the selected word and bit lines. Data is written into the selected memory cell or data is read from that memory cell. Reading/writing of this data is indicated by a reading/writing control signal applied to a control circuit.

Data is stored in the $N(=n \times m)$-bit memory cell array 41. Information relative to the memory cell in which reading/writing operation is performed is stored in row and column address buffers and the m-bit memory cell is coupled to the the sense amplifier by selecting a specific word line (one word line out of m word lines) by the row decoder 42. Then, by selecting specific bit line (one bit line out of m bit lines) by the column decoder 43, one of the sense amplifiers is coupled to the input/output circuit, whereby reading or writing operation is performed in accordance with a command of the control circuit.

FIG. 2 is an equivalent circuit diagram of a memory cell 40 of the DRAM which is shown to describe the writing/reading operation of the memory cell. Referring to FIG. 2, the memory cell 40 comprises a field effect transistor Q and a capacitor Cs. The gate electrode of the field effect transistor Q is connected to a word line 200 and the source/drain electrode connected to the capacitor Cs is connected to a bit line 300. In data writing, since the field effect type transistor Q becomes conductive when a predetermined voltage is applied to the word line 200, an electric charge applied to the bit line 300 is stored in the capacitor Cs. On the other hand, in data reading, since the field effect transistor Q becomes conductive when a predetermined voltage is applied to the word line 200, the electric charges stored in the capacitors Cs are taken out through the bit line 300.

In a semiconductor memory device, for example, the DRAM shown in FIG. 1, as a wiring method of signal lines transferring information from each memory cell to the sense amplifier, a bit line method (which is referred to as a folded bit line method) is known by which a pair of two bit lines are arranged from the sense amplifiers in the same direction. Referring to FIG. 3, a description is made of one of examples.

FIG. 3 is a schematic diagram showing the equivalent circuit structure of the conventional folded bit lines. As shown in FIG. 3, pairs of bit lines (BL0, $\overline{BL0}$), BL1, $\overline{BL1}$), ..., (BLm, BLm) are arranged in the same direction from the sense amplifiers SA and the plurality of memory cells are coupled to each bit line. In this case, for example, if another wiring line such as A is arranged adjacent to one bit line BL0 as a virtual wiring line, and The capacitance C between the wiring line A and the bit line BL0 is large, noise is generated when a certain potential is applied to the wiring line A, whereby the potential of the bit line BL0 is changed. On the other hand, since the bit line $\overline{BL0}$ is spaced apart from the wiring line A, the potential of the wiring line A is less influential on it. As a result, when comparison is made between the potentials at the bit line BL0 and $\overline{BL0}$ to detect a potential difference therebetween, malfunction of reversal of the result of the comparison between the potentials at the one and the other bit lines BL0 and $\overline{BL0}$ is caused by the fact that the potential of the bit line $\overline{BL0}$ fluctuates.

In order to solve that problem, a twisted bit line method is proposed, by which two bit lines are intersected with each other a plurality of times as shown in FIG. 4. By way of example, a description is made of, the adjacent wiring line A as a virtual wiring line. The noise from the wiring line A uniformly influences the adjacent wiring lines (in this case, it is assumed that the number of intersecting times, its distances and the like are set so that a load capacitance C with both bit lines BL0 and $\overline{BL0}$ may be the same), that is, the bit lines BL0 and $\overline{BL0}$. As a result, when the potentials of the bit lines BL0 and $\overline{BL0}$ are compared to detect a potential difference therebetween erroneous operation is avoided because the influence of the noise can be neglected.

Various wiring pattern regarding the above mentioned twisted bit line method are proposed. For example, a wiring arrangement including a set of two bit lines intersected once is disclosed in Patrick W. Bosshart et al. "553-Transistor LISP Processor Chip" ISSCC '87 Digest of Technical papers P. 202. Japanese Patent Laying-Open Gazette No. 254489/1985 discloses a wiring arrangement including two bit lines intersected in the middle every other bit line pair. In addition, Japanese Patent Laying-Open Gazette No. 51096/1987 discloses a wiring arrangement including bit line pairs intersected with each other at even number positions and bit line pairs intersected with each other at odd number positions, both of which are alternately arranged. U.S. Pat. No. 3,942,164 discloses a wiring arrangement including a set of two signal lines leading from the sense amplifier in the same direction and intersected at a position of one half or one fourth of its distance. Furthermore, Japanese Patent Laying-Open Gazette No. 26895/1988 discloses a wiring arrangement including a pair of bit lines connected to the sense amplifier and having a plurality of intersecting points which do not coincide with those of adjacent pair of bit lines.

However, although various wiring methods in accordance with the twisted bit line method were proposed as described above, a wiring structure for implementing the method, that is, the planar arrangement and the cross-sectional structure of a wiring layer have not been proposed yet. Recently, a memory cell has progressively become more compact as a degree of integration of a memory has been enhanced. The space between signal lines such as bit lines connected to each memory cell has been also reduced. Consequently, as the signal line connected to each memory cell becomes minute, it becomes noticeable that in a semiconductor memory device such as the DRAM, an error of information transmission due to the noise from another wiring line, so-called erroneous operation, is liable to occur. Therefore, it is desired that a specific configuration and structure of the wiring layer for implementing the twisted bit line method be proposed, in which malfunction of information transmission can be controlled by uniformly distributing the noise from another adjacent wiring line to a pair of signal lines.

SUMMARY OF THE INVENTION

The present invention was made to solve the above mentioned problems and it is an object of the present invention to provide a semiconductor memory device having a wiring structure which can control erroneous operation of information transmission by uniformly distributing a noise from another adjacent wiring line to each of two signal lines.

In addition, according to one aspect of the present invention, there is provided a semiconductor memory device having a wiring structure which implements the twisted bit line method without reducing the speed of the signal transmission.

Furthermore, according to another aspect of the present invention, there is provided a semiconductor memory device having a wiring structure which can reduce a wiring resistance value for implementing the twisted bit line method.

According to a further aspect, there is provided a semiconductor memory device which can minimize the additional capacitance in a wiring line for implementing the twisted bit line method.

According to an additional aspect, there is provided a DRAM having a folded bit line structure to reduce an effect of parasitic coupling of external signals thereto.

According to still another aspect, there is provided a semiconductor memory device having a wiring structure which can be made minute.

Another object of the invention is to provide a method of manufacturing a semiconductor memory device having a wiring structure which can control erroneous operation of information transmission by uniformly distributing a noise from another adjacent wiring line to each of two signal lines.

Further object of the invention is to provide a method of manufacturing a semiconductor memory device having a wiring structure which implements the twisted bit line method without reducing the speed of the signal transmission.

Still another object of the invention is to provide a method of manufacturing a semiconductor memory device having a wiring structure which can reduce a wiring resistance value for implementing the twisted bit line method.

Another object of the present invention is to provide a method of manufacturing a semiconductor memory device which can minimize the additional capacitance in a wiring line for implementing the twisted bit line method.

Another object of the present invention is to provide a method of a DRAM having a folded bit line structure to reduce an effect of parasitic coupling of external signals thereto.

Another object of the present invention is to provide a method of manufacturing a semiconductor memory device having a wiring structure which can be made minute.

A semiconductor memory comprises a semiconductor substrate, word lines and bit lines, memory cells and sense amplifier. The semiconductor substrate has a major surface. The word lines and bit lines intersect each other on the major surface of the substrate. The bit lines are arranged in the form of parallel bit line pairs. The memory cells are arranged at intersections of the word lines and the bit lines. The sense amplifier senses voltage differentials of the bit line pairs. Corresponding sections of the bit line of the bit line pair are interchanged laterally on the substrate along the length of the bit line pair. Corresponding sections of the bit lines of each bit line pair have the same number of joining portions respectively.

According to a preferred embodiment of a semiconductor memory device of the present invention, the bit lines of the bit line pair are located on a first level of the substrate. The bit line pair has at least one intersecting portion. At least one intersecting portion of the bit line pair is located at a second level of the substrate different from the first level.

According to a further preferred embodiment of a semiconductor memory device, corresponding sections of the bit lines of the bit line pair are interchanged vertically between first and second levels of the substrate.

According to still a further preferred embodiment of a semiconductor memory device having a wiring structure of the present invention, first and second conductive layers have an intersecting portion at a region where a memory device is formed. The memory device may be a dynamic memory device or a static memory device.

A method of reducing coupling of voltage differentials to a bit line pair comprises the following steps:
(a) the step of locating the bit lines of the bit line pair on a first level of the substrate;
(b) the step of interchanging locations of corresponding sections of the bit lines of the bit line pair laterally on the substrate along the length of the bit line pair, the bit line pair having at least one intersecting portion; and
(c) the step of locating at least one intersecting portion of the bit line pair at a second level of the substrate different from the first level.

A preferred embodiment of a method of reducing coupling of voltage differentials to a bit line pair comprises the following steps:
(a) the step of interchanging locations of corresponding sections of the bit lines of the bit line pair laterally on the substrate along the length of the bit line pairs; and (b) the step of interchanging locations of the corresponding sections of the bit lines of the bit line pair vertically between first and second levels of the substrate.

According to the present invention, corresponding sections of the bit lines of each bit line pair have the same number of joining portions respectively and are interchanged laterally on the substrate. Thus, the corresponding sections of the bit lines of each bit line pair are interchanged laterally under the same conditions on the substrate along the length of the bit line pair. Consequently, it is possible to provide a semiconductor memory device having a wiring structure capable of minimizing an influence due to the noise from the adjacent wiring line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to the figures, a description is made of one embodiment of the present invention.

Figure 5:
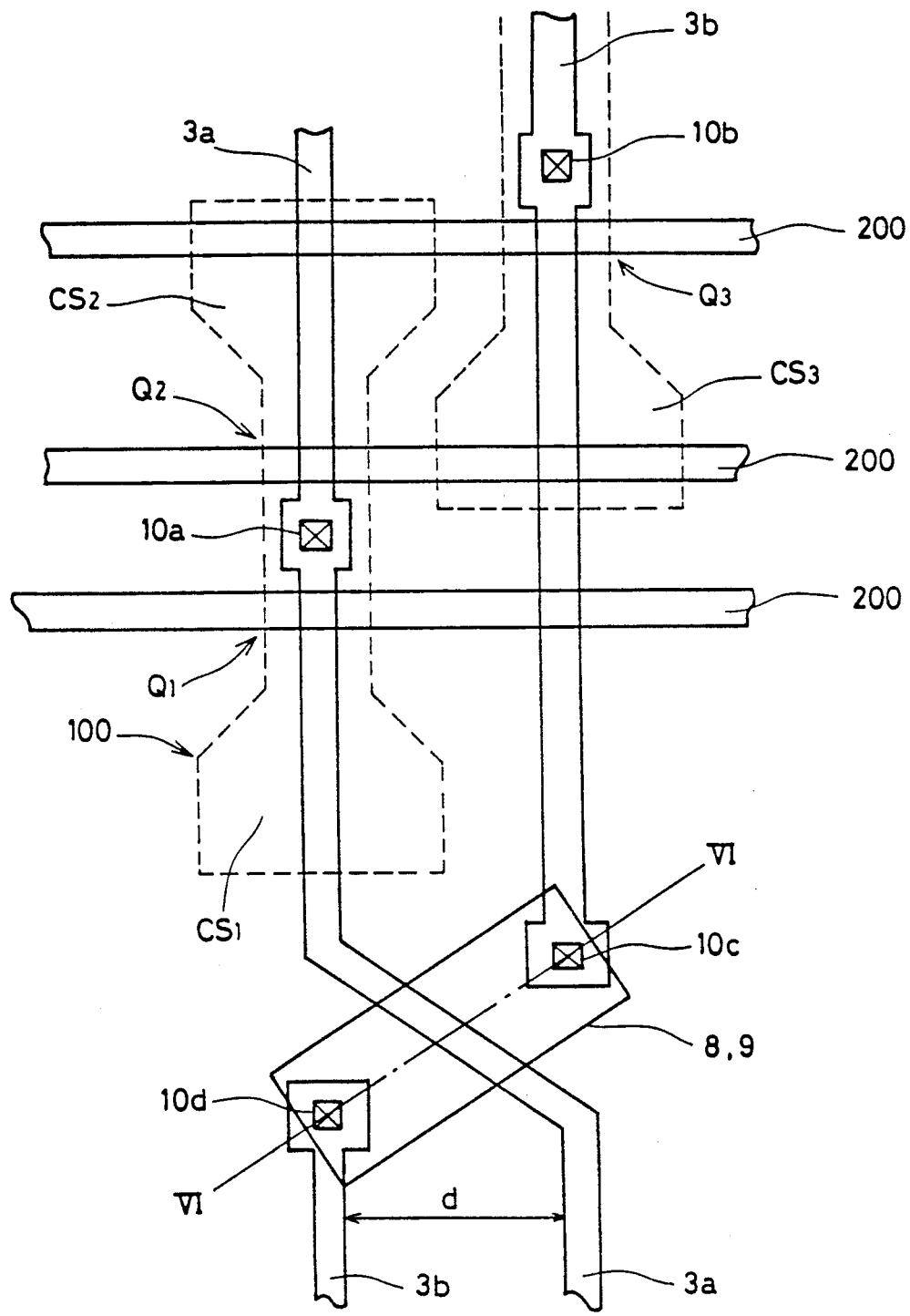
FIG. 5 is a partial plan view showing one embodiment of a semiconductor memory device having a wiring structure in accordance with the present invention.
Figure 6A:
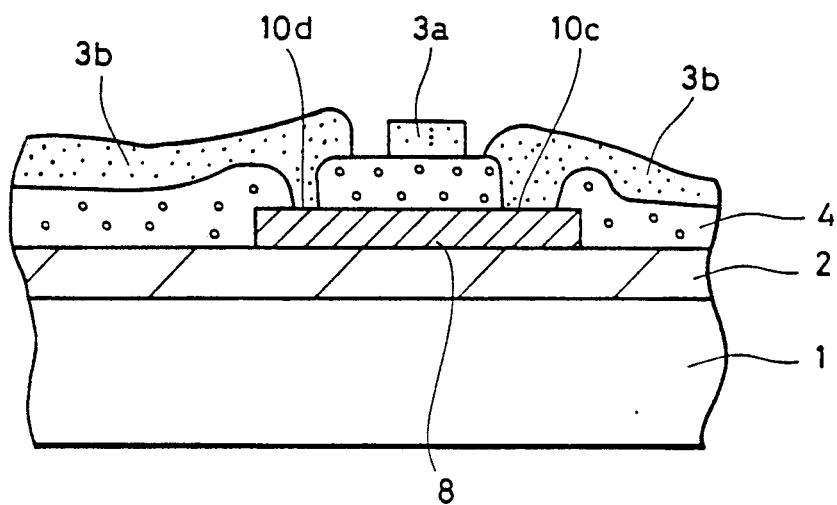
FIGS. 6A and 6B are sectional views taken along a line VI—VI in FIG. 5 and showing two examples of the wiring structure in accordance with the present invention.
Figure 6B:
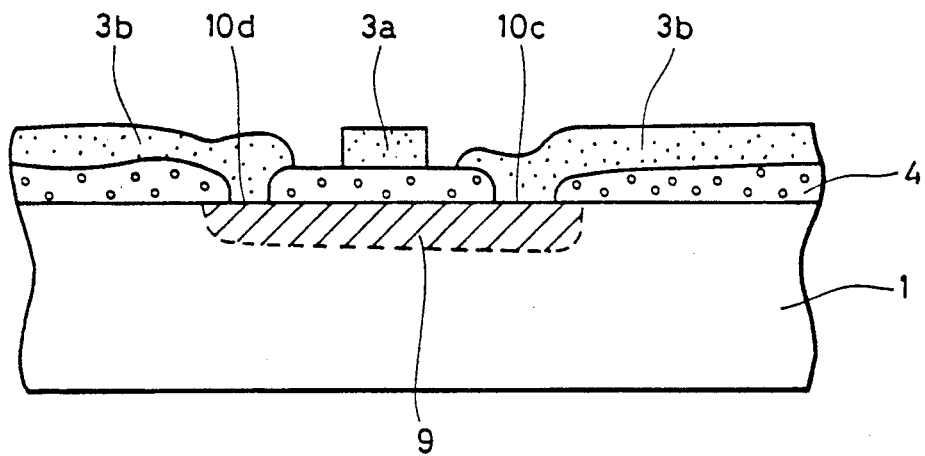

FIG. 5 is a partial plan view showing an example applied to a DRAM by way of one example of a semiconductor memory device having a wiring structure in accordance with the present invention. Referring to FIG. 5, a bit line 3a and a $\overline{\text{bit}}$ line 3b are formed so as to extend in the same direction on an uppermost layer. The bit line 3a is connected to the memory cell through a contact hole 10a. The $\overline{\text{bit}}$ bar line 3b is connected to the memory cell through a contact hole 10b. Each memory cell consists of a set of field effect transistors Q1, Q2, and Q3 and capacitors Cs 1, Cs 2, and Cs3 within an active region 100. The gate electrodes constituting parts of the transistors Q1, Q2, and Q3 serve for the word lines 200. The bit line 3a and $\overline{\text{bit}}$ line 3b are intersected at a region spaced apart from the memory cell. FIG. 6A and FIG. 6B are sectional views taken along a line VI—VI showing intersecting portion.

FIG. 6A is a sectional view showing a case where the bit line 3a and $\overline{\text{bit}}$ line 3b are intersected using one additional bridging wiring layer. Referring to this figure, a silicon oxide film 2 is formed on a silicon substrate 1. The bit line 3a and $\overline{\text{bit}}$ line 3b made of, for example, aluminum are formed on the silicon oxide film 2 through an interlayer insulating film 4. A bridging wiring layer 8 having a low resistance value made of, for example, high melting point metal silicide is partially formed beneath the bit line 3a through the interlayer insulating film 4, so that a bit line 3a and $\overline{\text{bit}}$ line 3b are intersected. The $\overline{\text{bit}}$ line 3b is connected to the bridging wiring layer 8 through contact holes 10c and 10d. In this case, additional capacitance of the connection portion of the interlayer insulating film 4 can be minimized by forming thickly the insulating film 4 made of low conductor such as $SiO_2$.

FIG. 6B is a sectional view showing a case where the $\overline{\text{bit}}$ line 3b is bridged by an impurity diffusion layer on the intersecting portion. According to this figure, for example, an impurity diffusion wiring layer 9 made of an N type impurity diffusion region is formed on the P type silicon substrate 1. This impurity diffusion wiring layer 9 is used as the bridging wiring layer of the $\overline{\text{bit}}$ line 3b. The $\overline{\text{bit}}$ line 3b is connected to the impurity diffusion wiring layer 9 through the contact holes 10c and 10d. The bit line 3a is formed above the impurity diffusion wiring layer 9 through the interlayer insulating film 4. In this way, it is possible to intersect bit lines using the impurity diffusion wiring layer without forming an additional layer above the substrate. Meanwhile, in this structure it is difficult to lower the bit line resistance value, to control the additional capacitance and the like because the impurity diffusion layer is used as the bridging layer. Therefore, in order to increase the rate of the signal transmission, it is preferred to apply the wiring structure shown in FIG. 6A when the bit lines are intersected using only one bridging wiring layer.

Figure 7:
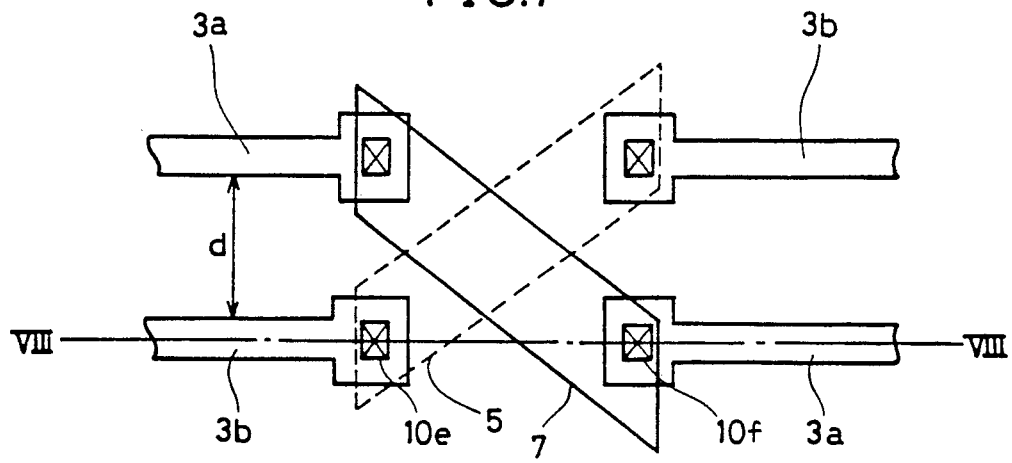
FIG. 7 is a partial plan view showing another embodiment of a wiring structure in accordance with the present invention.
Figure 8A:
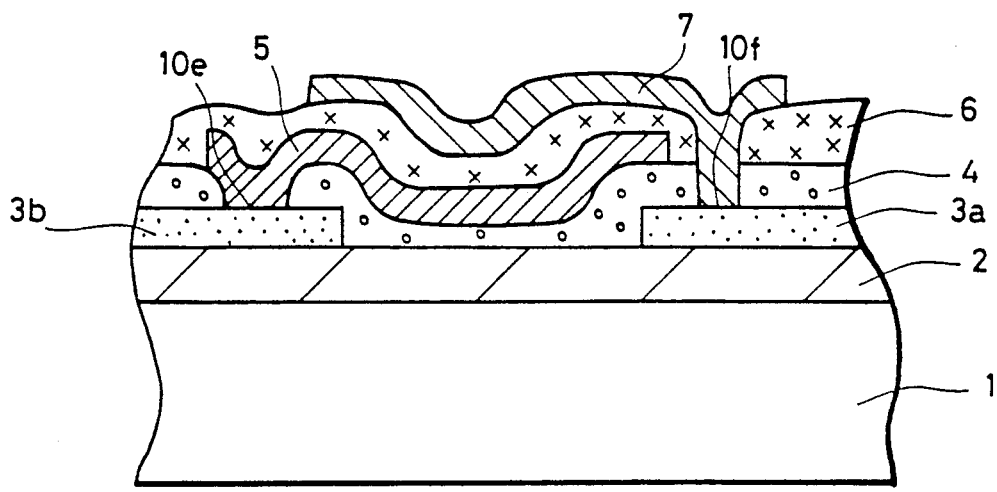
FIGS. 8A, and 8B are sectional views taken along a line VIII—VIII and showing two examples of wiring structure in accordance with the present invention.
Figure 8B:
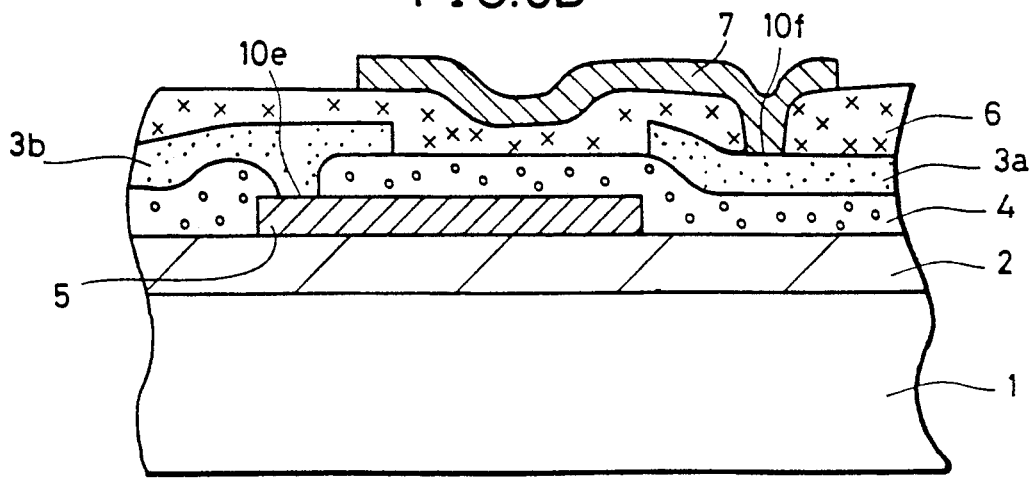

FIG. 7 is a partial plan view showing an embodiment of another wiring structure in accordance with the present invention. Referring to this figure, the bit line 3a and $\overline{bit}$ line 3b are intersected using two bridging wiring layers 5 and 7. FIGS. 8A and 8B are sectional views showing this wiring structure taken along a line VIII—VIII in FIG. 7.

Referring to FIG. 8A, the bit line 3a and the $\overline{bit}$ line 3b are formed on the silicon oxide film 2 which is formed on the silicon substrate. In order to intersect the $\overline{bit}$ line 3b and the bit line 3a, for example bridging wiring layers 5 and 7 made of aluminum are formed thereon. The wiring layer 5 is formed on the interlayer insulating film 4 and connected to the $\overline{bit}$ line 3b through a contact hole 10e. The bridging wiring layer 7 is formed on the interlayer insulating film 6 and connected to the the bit line 3a through a contact hole 10f. In this way, the bit lines can be intersected using the bridging wiring layer. In this case, either one of the bridging wiring layers 5 and 7 may be formed beneath the bit lines. FIG. 8B is a sectional view showing a case where the bridging wiring layer 5 is formed beneath the $\overline{bit}$ line 3b and the bridging wiring layer 7 is formed on the bit line 3a. In either case, the bit line resistance value an be lowered by forming the bridging wiring layer made of material having a low resistance value such as a aluminum and additional capacitance can be minimized by using the thick insulating film as the interlayer insulating film 6. Therefore, two bit lines can be intersected without decreasing the rate of the signal transmission by lines.

Figure 9:
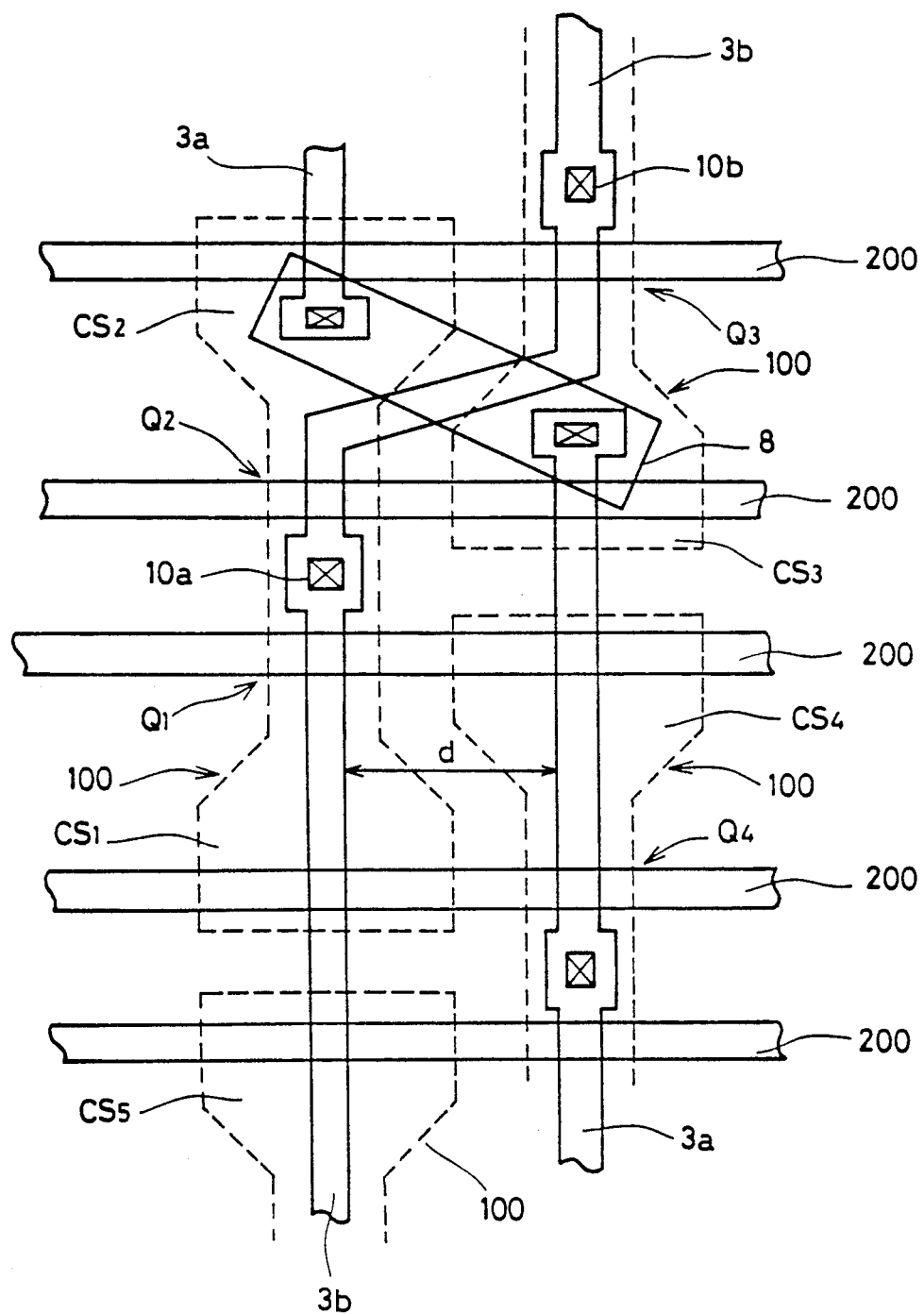
FIG. 9 is a partial plan view showing another embodiment of a semiconductor memory device having a wiring structure in accordance with the present invention.

In the wiring arrangement shown in FIG. 5, the intersecting portion of the bit lines are provided on a region other than the region where the memory cell is formed. However, as shown in FIG. 9, the intersecting portion of the bit lines may be formed above the region where the memory cell is formed. It is needless to say that the same effect can be obtained even if the bridging wiring layer 8 is formed such that the bit lines may be intersected above the region where the the memory cell is formed in this way. By forming the wiring layer so as to have the intersecting portion above the region where the memory cell is formed, it becomes needless to provide an additional the region for forming the intersecting portion and a high degree of integration of the memory can be provided.

Furthermore, since it is common to form the bit line 3a and the $\overline{bit}$ line 3b of conductive layers having the same level in the wiring arrangement shown in FIG. 5, 7 or 9, a space d between lines in this case is limited by working limitation in photolithographic technique. According to the wiring structure shown in FIGS. 6A, 6B, 8A and 8B, the influence due to the noise from the adjacent wiring line can be minimized by only making an effect of two-dimensional parasitic coupling equivalent. Therefore, the following structure is desired, that is, the structure which can control the erroneous operation of information transmission by making the space between two signal lines small and uniformly distributing the noise from another adjacent wiring line, particularly, a three-dimensional parasitic coupling to each of two signal lines.

Figure 10A:
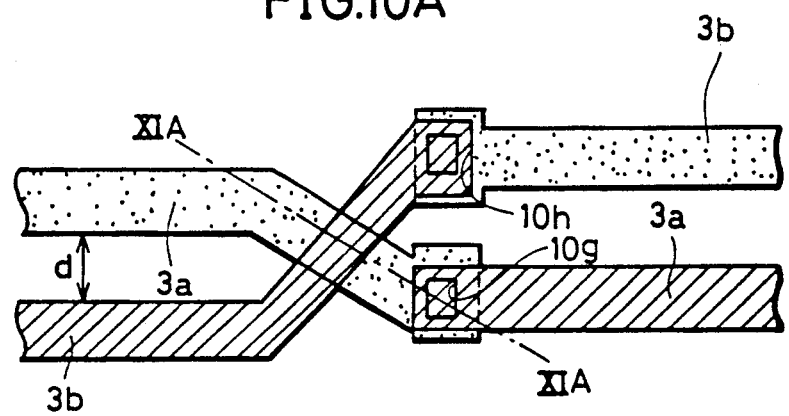
FIGS. 10A and 10B are a partial plan views showing other embodiments of a wiring structure in accordance with the present invention and showing a wiring structure capable of making a space between two signal lines minute.
Figure 10B:
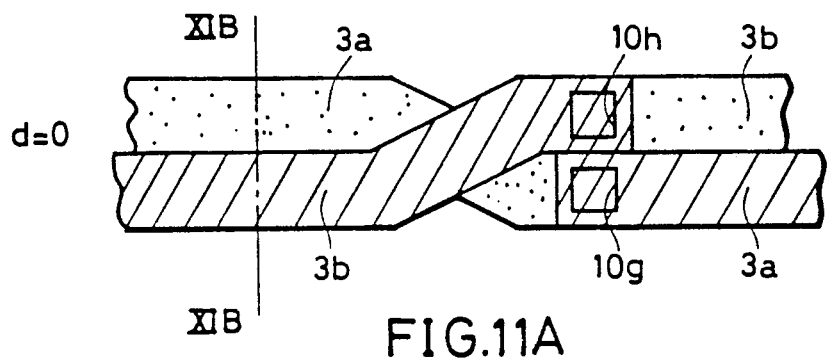
Figure 11A:
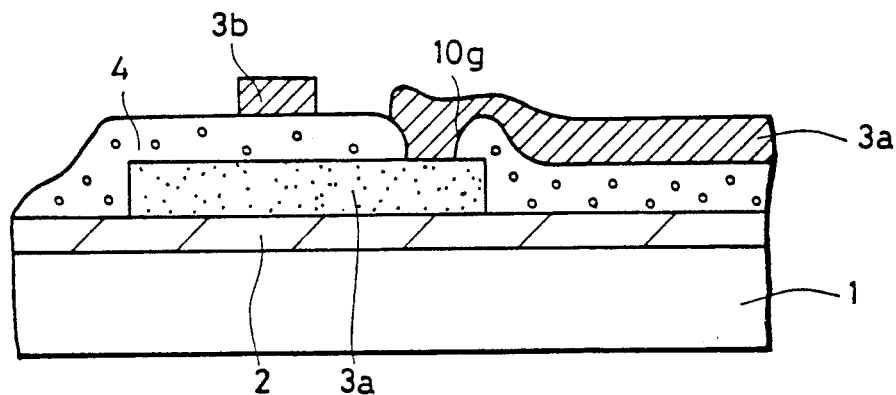
FIGS. 11A and 11B are sectional views taken long a line XIA—XIA and XIB—XIB in FIGS. 10A and 10B.
Figure 11B:
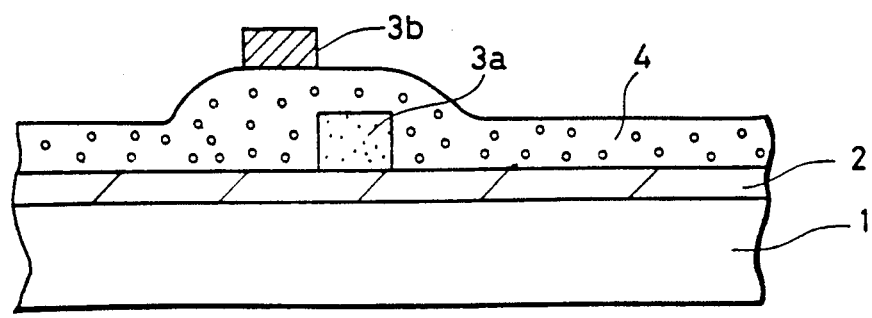

FIGS. 10A, 10B and 11A, 11B show other embodiments of a wiring structure in accordance with the present invention. FIGS. 10A and 10B are partial plan views showing the wiring structure capable of making the space between two signal lines small and FIG. 11A and 11B are sectional views taken along a line XIA—XIA and XIB—XIB of FIG. 10A and 10B.

Referring to these embodiment, either one of the bit line 3a and $\overline{bit}$ line 3b, for example the bit line 3a, is formed by, for example a first polycrystal silicon layer on the surface of the silicon oxide film 2 which is formed on the silicon substrate 1 comprising the memory cells and the peripheral circuits. On the bit line 3a, the $\overline{bit}$ line 3b is formed by a second polycrystal silicon layer through the interlayer insulating film 4 such as $SiO_2$. In this case, the space d between bit lines can be reduced because the bit line 3a and $\overline{bit}$ line 3b are formed of conductive layers having different levels which are constituted by upper and lower layers. Two bit lines can be formed to have contiguous inner sides lying on a common vertical plane each other, which means d=0 as shown in FIGS. 10B and 11B. After the bit line 3a and the $\overline{bit}$ line 3b are intersected, the levels of the conductive layers constituting bit lines are exchanged through the contact holes 10g, 10h provided in the interlayer insulating film 4. More specifically, when the bit line 3a is formed of the polycrystal silicon layer, the bit line 3a is connected to the upper layer of the second polycrystal silicon layer through the contact hole 10g after intersection, while the $\overline{bit}$ line 3b formed of a second polycrystal silicon layer is connected to the lower layer of the polycrystal silicon layer through the contact hole 10h after intersection.

Figure 1:
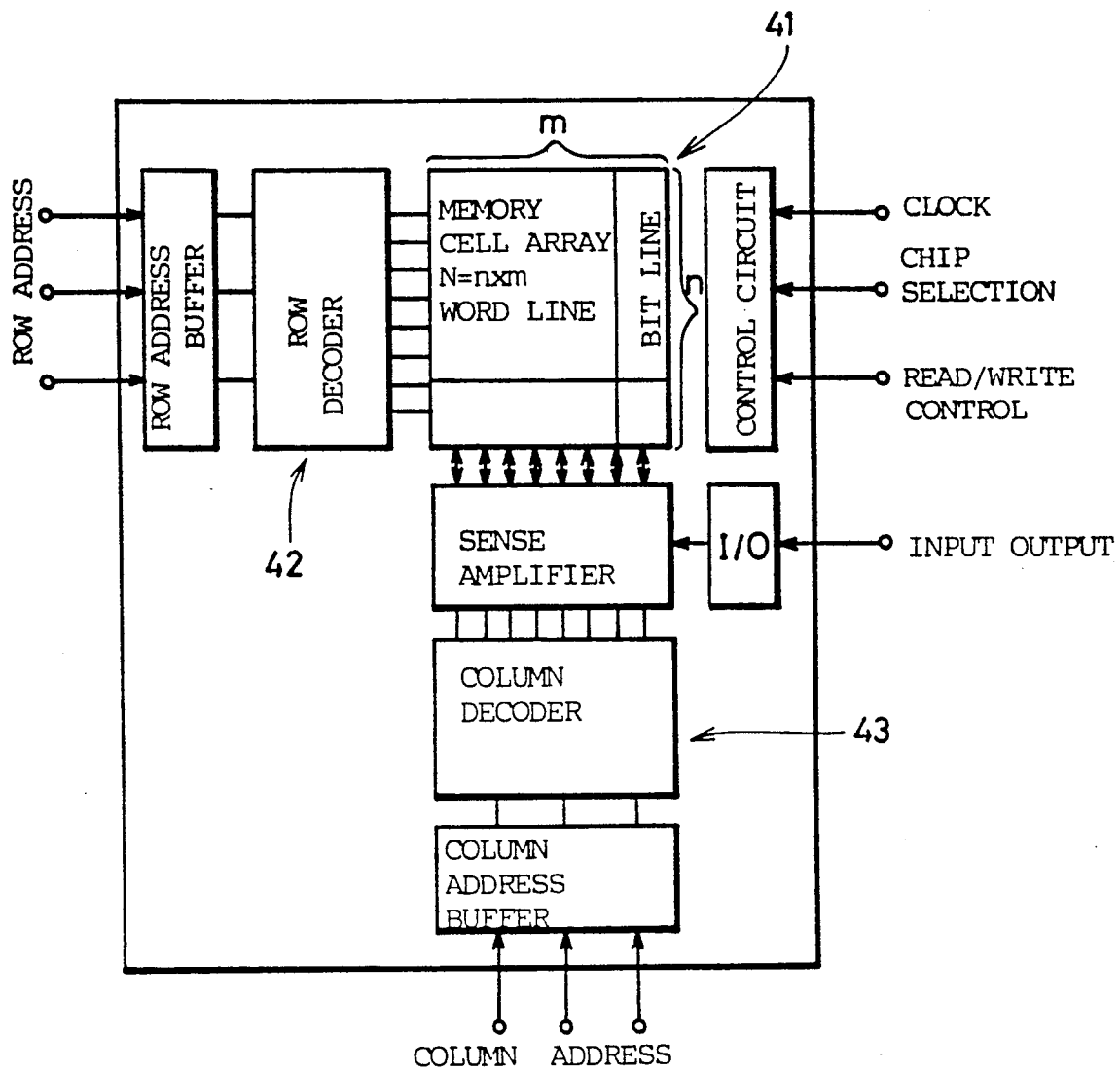
FIG. 1 is a block diagram showing the whole structure of a conventional DRAM taken as one example of a semiconductor memory device having a wiring structure.
Figure 2:
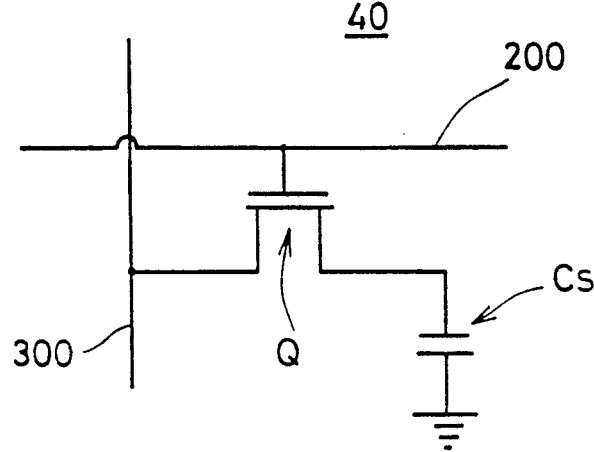
FIG. 2 is an equivalent circuit diagram corresponding to one memory cell of the DRAM shown in FIG. 1.
Figure 3:
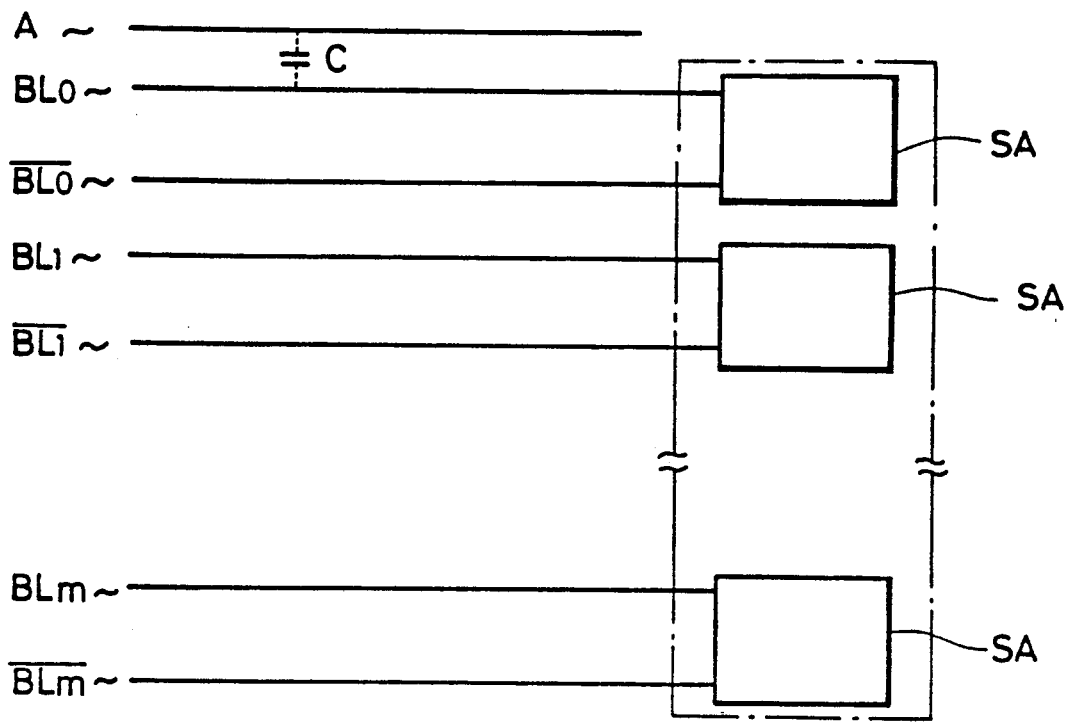
FIG. 3 is a schematic view of the equivalent circuit structure showing a conventional folded bit line method.
Figure 4:
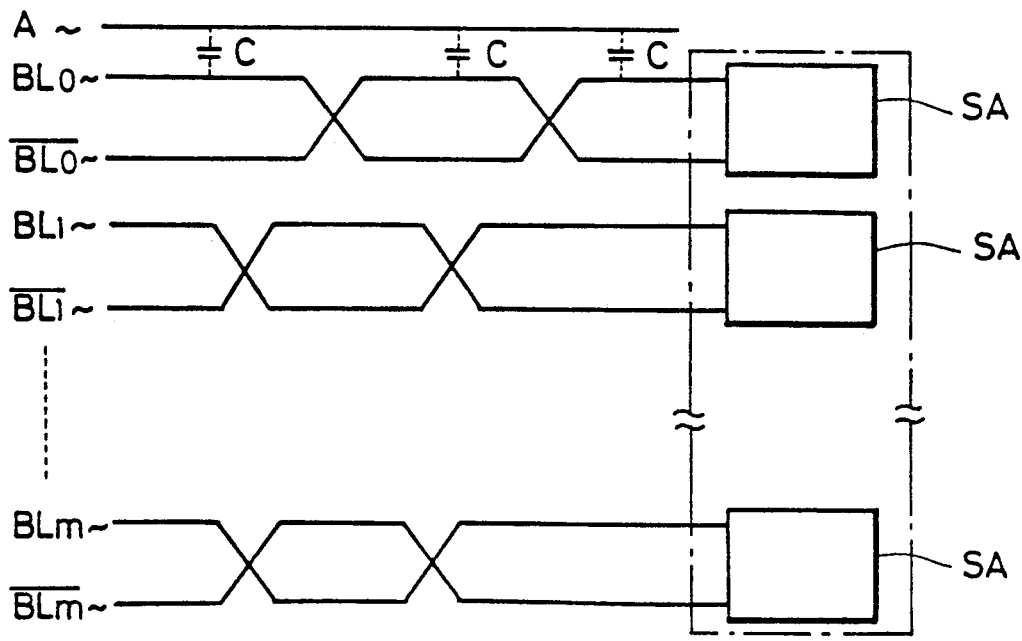
FIG. 4 is a schematic view of the equivalent circuit structure showing a conventional twisted bit line method.

According to the above mentioned embodiment, two bit lines are formed of the conductive layers having different levels of the first and second polycrystal silicon layers and they are intersected with each other a plurality of times in an electrically separated state. The levels of the conductive layers constituting two bit lines are replaced with each other through the contact holes before and after this intersection. As a result, the wiring structure for implementing the equivalent circuit shown in FIG. 4 is formed, the influence due to the noise from the adjacent wiring line can be minimized by making an effect of three-dimensional parasitic coupling equivalent and also the space between bit lines can be made smaller.

A description is made of a method for manufacturing the semiconductor memory device having the wiring structure in accordance with the present invention. FIGS. 12A through 12D show sectional views taken along a line VIII—VIII in FIG. 7 in the order of the steps. A description is now made of a method for forming the wiring structure having the section shown in FIG. 8A.

Figure 12A:
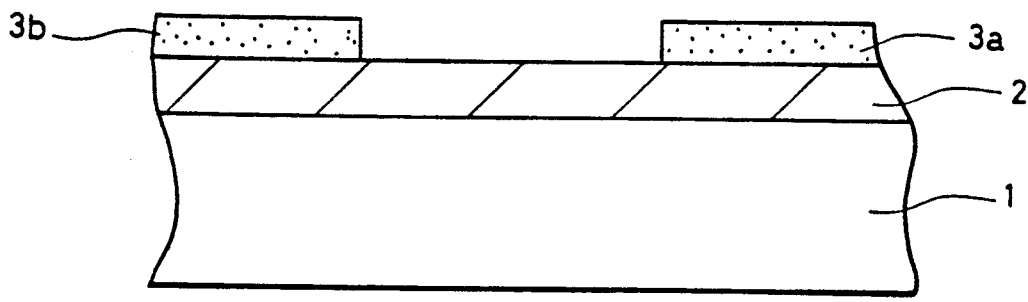
FIGS. 12A, 12B, 12C, and 12D are sectional views showing a manufacturing method of the wiring structure having the section shown in FIG. 8A in the order of the steps.

At first, referring to FIG. 12A, a silicon oxide film 2 is formed on a silicon substrate 1. Thereafter, a bit line 3a and a $\overline{bit}$ line 3b are formed by forming and patterning, for example a polycrystal silicon layer on the silicon oxide film 2.

Figure 12B:
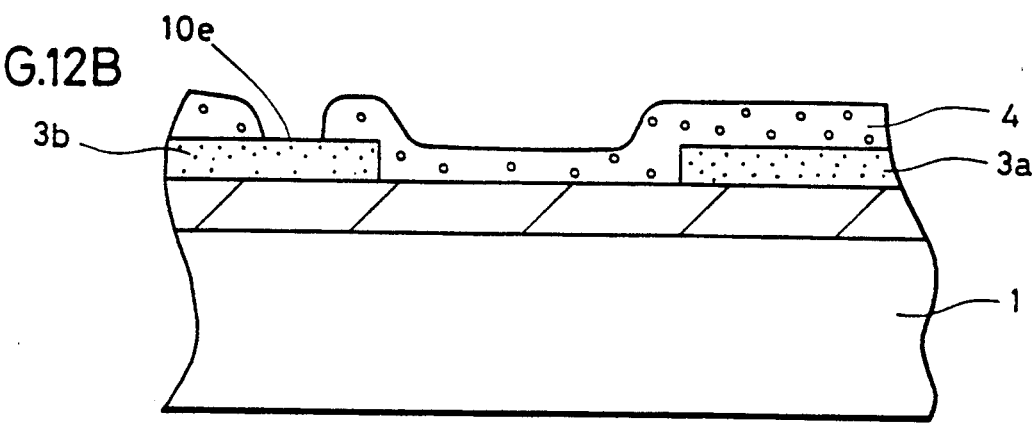

Referring to FIG. 12B, an interlayer insulating film 4 made of $SiO_2$ and the like is formed on the whole surface. Then, a contact hole 10e is formed on the $\overline{bit}$ line 3b.

Figure 12C:
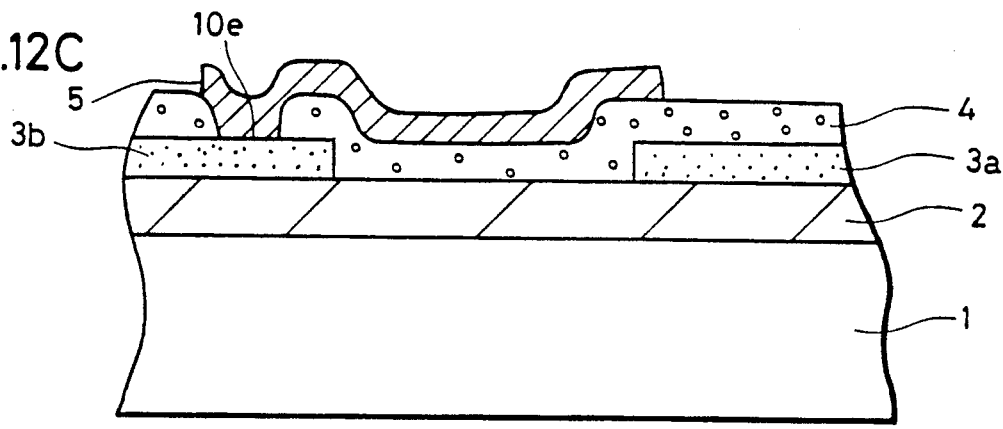

Referring to FIG. 12C, a bridging wiring layer 5 is formed of a material having a low resistance value such as aluminum and the like in accordance with a predetermined pattern.

Figure 12D:
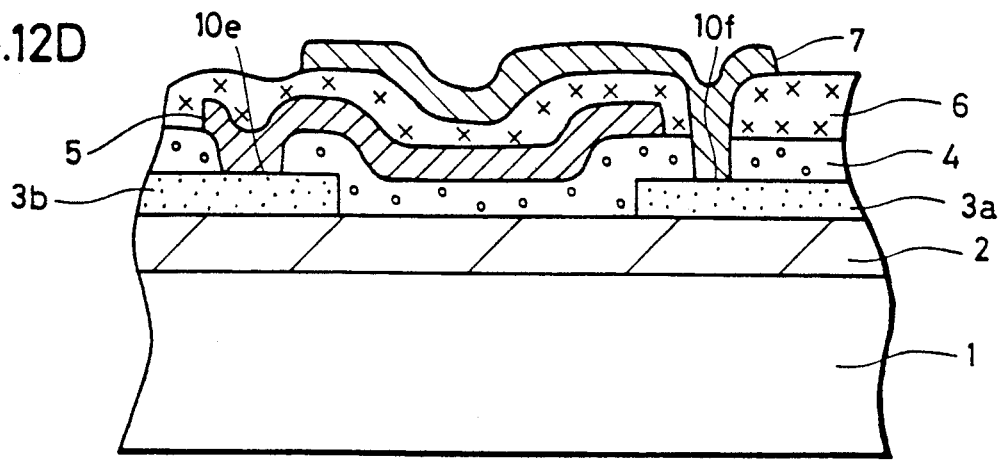
Figure 13A:
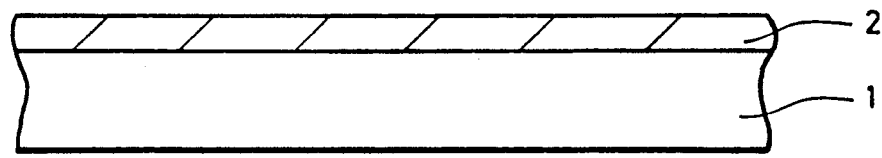
FIGS. 13A, 13B, 13C and 13D are sectional views showing a manufacturing method of the wiring structure having the section shown in FIG. 11A in order of the steps.
Figure 13B:
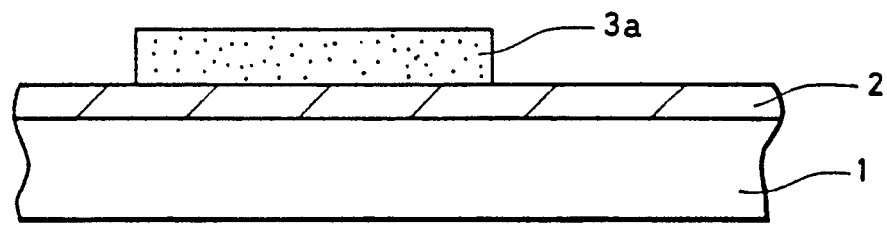
Figure 13C:
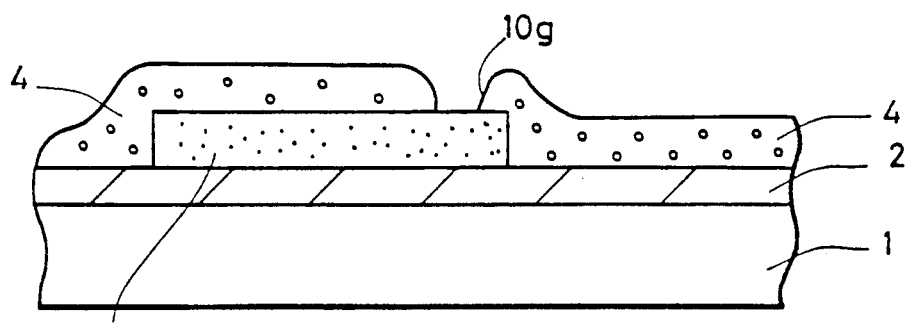
Figure 13D:
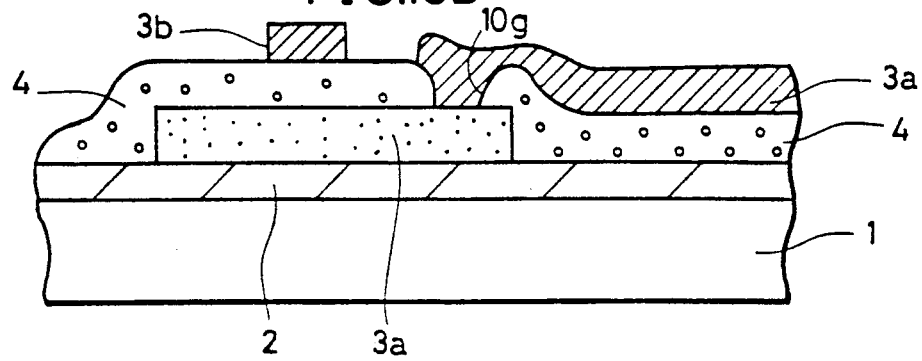

As shown in FIG. 12D, after an interlayer insulating film 6 is formed on the whole surface, a contact hole 10f is opened. Then, a bridging wiring layer 7 is formed of a material having a low resistance value in accordance with the predetermined pattern so as to connect the bit line 3a to the bridging wiring layer 7 through the contact hole 10f. In this way, the intersecting portion of the bit line 3a and the $\overline{\text{bit}}$ line 3b is formed using two bridging wiring layers 5 and 7.

FIGS. 13A through 13D show sectional views taken along a line XIA—XIA in FIG. 10A in the order of the steps. Referring to FIGS. 13A to 13D, the wiring structure having the section shown in FIG. 11A is formed in similar process as the process for forming the wiring structure shown in FIGS. 12A through 12D as described above.

Figure 14A:
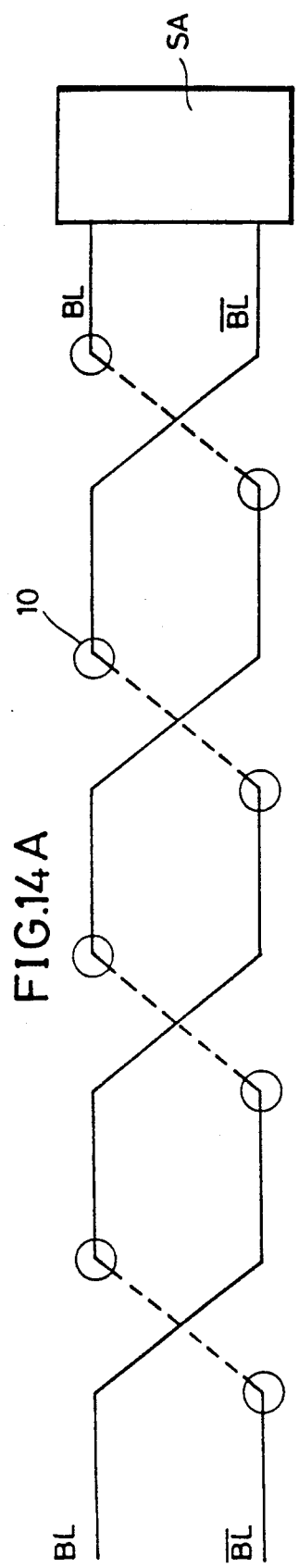
FIG. 14A is a schematic view of the equivalent circuit structure showing the wiring structure corresponding to the sectional views shown in FIGS. 6A and 6B.
Figure 14B:
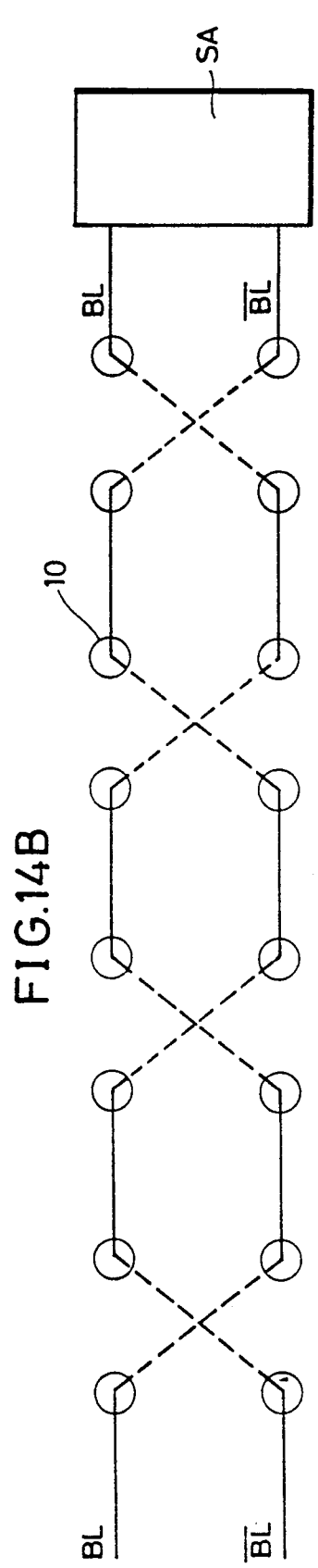
FIG. 14B is a schematic view of the equivalent circuit structure showing the wiring structure corresponding to the sectional views shown in FIGS. 8A and 8B.
Figure 14C:
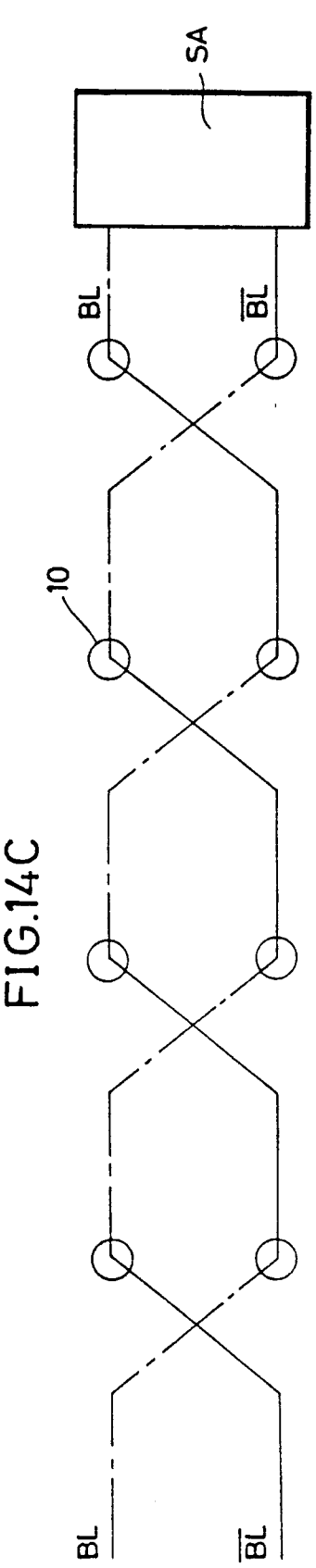
FIG. 14C is a schematic view of the equivalent circuit structure showing the wiring structure corresponding to the sectional views shown in FIGS. 10A and 10B.

FIG. 14A, 14B and 14C are schematic views of the equivalent circuit structure showing the wiring structure corresponding to the sectional views shown in FIG. 6A and 6B, FIG. 8A and 8B, and FIGS. 10A and 10B respectively. Referring to these figures, bit lines BL and $\overline{\text{BL}}$ shown in solid lines are located at a first level of the substrate and bit lines BL and $\overline{\text{BL}}$ shown in one dotted lines are located at a second level of the substrate. The bit lines BL and $\overline{\text{BL}}$ are connected to a sense amplifier SA. Bridging wiring lines shown in broken lines are located at a second level or a third level of the substrate. As shown in FIGS. 14A and 14B, the bit lines BL and $\overline{\text{BL}}$ are interchanged laterally by connecting the bit lines to the bridging wiring lines through contact holes 10. Referring to FIG. 14C, the bit lines BL and $\overline{\text{BL}}$ are intersected and interchanged vertically between the first and second levels of the substrate by connecting the bit lines to the corresponding sections of the bit lines located at the different level through contact holes 10. In either case, corresponding sections of the bit lines of each bit line pair have the same number of contact portions 10. Thus, the corresponding sections of the bit lines of each bit line pair are interchanged laterally under the same conditions on the substrate along the length of the bit line pair. Consequently, it is possible to provide a DRAM having a folded bit line structure capable of minimizing an influence due to the noise from the adjacent wiring line by reducing an effect of parasitic coupling of external signals thereto.

Although the polycrystal silicon layer was used as a bit line and an aluminum layer was used as a bridging wiring layer by way of one example of the above mentioned manufacturing steps, another material having a low resistance value may be used and the wiring layer may be made of a high melting point metal layer, a high melting point metal silicide layer, a composite film consisting of a polycrystal silicon layer and a high melting point metal layer, a low melting point metal layer other than aluminum or the like.

Although a description was made of a case where the wiring structure in accordance with the present invention is applied to a set of bit lines in the above described embodiment, that can be, of course, applied to a plurality of sets of bit lines. Although the above described embodiment shows a case where bit lines intersect at one point, it may be applicable to bit lines having a plurality of intersecting portions.

In addition, although the example applied to bit lines in the DRAM is shown in the above described embodiment, if the wiring arrangement is a combination of signal lines transmitting signals which are compared with each other, such as a reference line and a comparison line, the present invention can be applied to a various wiring layers and the same effect can be obtained. For example, the present invention may be applied to one set of signal lines transmitting signals which are compared with each other on the semiconductor memory device other than the DRAM.

Figure 15:
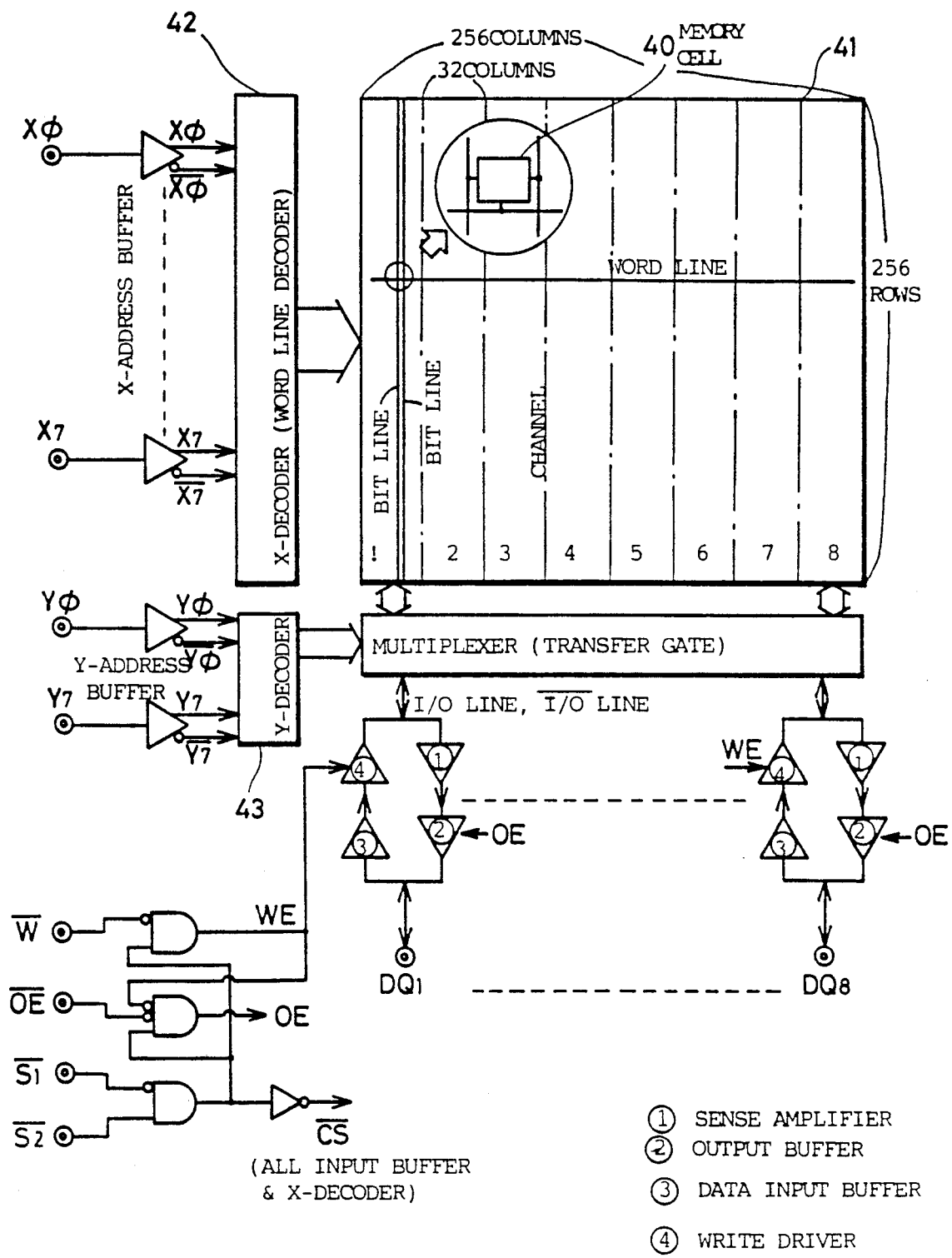
FIG. 15 is a block diagram showing an example of the whole structure of another semiconductor memory device to which the wiring structure in accordance with the present invention can be applied.

FIG. 15 is a block diagram showing one example of the whole structure of another semiconductor memory device to which the wiring structure in accordance with the present invention can be applied. FIG. 15 shows the whole structure of a static random access memory (hereinafter referred to as a SRAM).

Referring to FIG. 15, the SRAM comprises a memory cell array 41 comprising a plurality of memory cells 40 serving as a memory portion, and an X decoder 42 connected to an address buffer selecting its address, a Y decoder 43, and input/output interface portion comprising a sense amplifier connected to an output buffer. The plurality of memory cells 40 serving as the memory portion are connected to intersecting points between word lines connected to the X decoder 42 and bit lines connected to the Y decoder 43, which are constituted in a matrix fashion, thereby constituting the memory cell array 41. By receiving externally applied row and column address signals the memory cell 40 which is located at an intersecting point between the word line and the bit line which are selected by the X decoder 42 and the Y decoder 43, respectively, is selected.

When the information stored in the memory cell 40 is read, a predetermined voltage is applied to the word line. As a result, a potential corresponding to the state appears on the bit line and the $\overline{\text{bit}}$ line. When information is written into the memory cell 40, a predetermined voltage is applied to the word line. In that state, desired potentials corresponding to the states to be written are applied to the bit line and $\overline{\text{bit}}$ line. In this way, the bit line and $\overline{\text{bit}}$ line are provided for transmission of two signals to be compared. Therefore, the wiring structure in accordance with the present invention can be applied to the bit lines in the SRAM like the bit lines in the DRAM.

As described above, according to the present invention, it is possible to provide a wiring structure which can minimize the influence due to the noise from the adjacent wiring line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
   a semiconductor substrate having a major surface;
   word lines and bit lines intersecting each other on the major surface of said substrate, said bit lines arranged in the form of parallel bit line pairs;
   memory cells arranged at intersections of said word lines and said bit lines; and
   sense amplifier means for sensing voltage differentials of each bit line pair;
   corresponding portions of each bit line of each bit line pair alternating laterally and being located in different planes parallel to the surface of said substrate;
   the total length of said each bit line located in any one of said different planes parallel to the surface of said substrate being equal to the total length of the other bit line of said bit line pair located in the same plane of said substrate.

2. A semiconductor memory in accordance with claim 1, wherein contact holes are formed in the vicinity of the region where said corresponding portions of the bit lines alternate.

3. A semiconductor memory in accordance with claim 1, wherein said memory comprises a dynamic memory device.

4. A semiconductor memory in accordance with claim 1, wherein said memory comprises a static memory device.

5. A semiconductor memory comprising:
a semiconductor substrate having a major surface;
word lines and bit lines intersecting each other on the major surface of said substrate, said bit lines arranged in the form of parallel bit line pairs;
memory cells arranged at intersections of said word lines and said bit lines; and sense amplifier means for sensing voltage differentials of each bit line pair;
each bit line pair including successive sections of parallel bit line portions located in a first plame, parallel to displaced from said major surface of said substrate;
said successive sections comprising bit line portions interchanged with corresponding portions alternately and laterally on said substrate along the length of said bit line pair, each bit line pair having at least one intersecting portion for interconnecting said successive sections; and
said at least one intersecting portion of said bit line pair being located in a second plane of said substrate different from said first plane, wherein each bit line of each bit line pair includes at least one said intersecting portion located in said second plane.

6. A semiconductor memory in accordance with claim 5, wherein said at least one intersecting portion of said bit line pair comprises an impurity region.

7. A semiconductor memory in accordance with claim 5, wherein said at least one intersecting portion of said bit line pair comprises an additional conductive layer.

8. A semiconductor memory in accordance with claim 7, wherein said additional conductive layer comprises a conductive layer in a lower plane.

9. A semiconductor memory in accordance with claim 7, wherein said additional conductive layer comprises a conductive layer in a higher plane.

10. A semiconductor memory in accordance with claim 5, wherein each bit line pair has said at least one intersecting portion in the region where said memory cells are formed.

11. A semiconductor memory in accordance with claim 5, wherein each bit line pair has said at least one intersecting portion in the region other than the region where said memory cells are formed.

12. A semiconductor memory in accordance with claim 5, wherein said memory comprises a dynamic memory device.

13. A semiconductor memory in accordance with claim 5, wherein said memory comprises a static memory device.

14. In a semiconductor memory of a type having semiconductor substrate, word lines and bit lines intersecting each other on a major surface of said substrate and memory cells arranged at intersections of said word lines and said bit lines, said bit lines arranged in the form of parallel bit line pairs, and sense amplifier means for sensing voltage differentials of said bit line pairs, and wherein signals capacitively coupled to said bit line pairs tend to induce error voltage differentials therein,
a method of reducing coupling of voltage differentials to a bit line pair, comprising the steps of:
locating successive sections of parallel bit line portions said bit lines of each bit line pair in a first plane, parallel to and displaced from said major surface of said substrate;
interchanging locations of corresponding parallel portions of said sections of the bit lines of each bit line pair alternately and laterally on said substrate along the length of said bit line pair;
interconnecting said successive sections by intersecting bit line portions;
locating at least one intersecting portion of said bit line pair in a second plane of said substrate different from said first plane, each bit line of each bit line pair including at least one said intersecting portion located in said second plane.

15. In a semiconductor memory of a type having semiconductor substrate, word lines and bit lines intersecting each other on a major surface of said substrate and memory cells arranged at intersections of said word lines and said bit lines, said bit lines arranged in the form of parallel bit line pairs, and sense amplifier means for sensing voltage differentials of said bit line pairs, and wherein signals capacitively coupled to said bit line pairs tend to induce error voltage differentials therein,
a method of reducing coupling of voltage differentials to a bit line pair, comprising the steps of:
interchanging locations of corresponding sections of the bit lines of each bit line pair alternately and laterally on said substrate along the length of said bit line pair; and
interchanging locations of said corresponding sections of each of said bit lines of said bit line pair vertically between first and second planes, parallel to and displaced from said major surface of said substrate, each bit line being of substantially the same length in each plane as the length of the corresponding bit line of the bit line pair.

16. A method in accordance with claim 15, including the step of aligning facing sides of said bit lines of each said bit line pair on a common plane normal to said substrate.

17. A semiconductor memory comprising:
a semiconductor substrate having a major surface;
word lines and bit lines intersecting each other on the major surface of said substrate, each bit line comprising a plurality of different portions arranged in first and second parallel planes of said substrate, said bit lines arranged in the form of bit line pairs;
memory cells arranged at intersections of said word lines and said bit lines; and
sense amplifier means for sensing voltage differentials of each bit line pair;
the bit lines of at least one bit pair forming a twisted pair by intersecting each other at an even number of crossover regions of said substrate;
the bit lines of at least one bit line pair in said crossover regions lying respectively in said first and said second planes and being parallel to each other in portions of said substrate outside said crossover regions.

wherein within the crossover regions of said twisted pair the composite length of said bit line lying in said first plane of said substrate is equal to the composite length of the same bit line lying in said second plane of said substrate.

18. A semiconductor memory comprising:
a semiconductor substrate having a major surface;
word lines and bit lines intersecting each other on the major surface of said substrate, said bit lines arranged in the form of parallel bit line pairs;
memory cells arranged at intersections of said word lines and said bit lines; and
sense amplifier means for sensing voltage differentials of each bit line pair;
the bit lines of successive portions of each bit line pair alternating laterally and being parallel to a plane of said substrate and lying alternately at first and second planes parallel to the surface of said substrate to form a twisted pair, each bit line being of substantially the same length in each plane as the length of the corresponding bit line of the bit line pair.

19. A semiconductor memory comprising:
a semiconductor substrate having a major surface;
word lines and bit lines intersecting each other on the major surface of said substrate, each bit line comprising a plurality of different portions arranged in first and second parallel planes of said substrate, said bit lines arranged in the form of parallel bit line pairs;
memory cells arranged at intersections of said word lines and said bit lines; and
sense amplifier means for sensing voltage differentials of each bit line pair;
each bit line pair divided to form successive alternate parallel and crossover portions, the bit lines being parallel to each other in the parallel portions, the bit lines in said crossover portions being located in different planes parallel to the major surface of the substrate and intersecting with each other so that the bit lines in adjacent parallel portions are interchanged, each bit line being of substantially the same length in each plane as the length of the corresponding bit line of the bit line pair.

* * * * *